(12) United States Patent
Hattori et al.

(10) Patent No.: US 10,032,788 B2
(45) Date of Patent: Jul. 24, 2018

(54) SEMICONDUCTOR MEMORY DEVICE

(71) Applicant: Toshiba Memory Corporation, Minato-ku (JP)

(72) Inventors: Shigeki Hattori, Kawasaki (JP); Masaya Terai, Kawasaki (JP); Hideyuki Nishizawa, Toshima (JP); Koji Asakawa, Kawasaki (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 3 days.

(21) Appl. No.: 15/064,760

(22) Filed: Mar. 9, 2016

(65) Prior Publication Data
US 2016/0284869 A1 Sep. 29, 2016

(30) Foreign Application Priority Data
Mar. 24, 2015 (JP) .................. 2015-060237

(51) Int. Cl.
*H01L 29/792* (2006.01)
*H01L 27/115* (2017.01)
(Continued)

(52) U.S. Cl.
CPC .... *H01L 27/11582* (2013.01); *H01L 51/0091* (2013.01); *H01L 51/0092* (2013.01);
(Continued)

(58) Field of Classification Search
CPC ............ H01L 51/0092; H01L 51/0091; H01L 27/11582; H01L 27/281; H01L 27/285
See application file for complete search history.

(56) References Cited

U.S. PATENT DOCUMENTS 6,501,000 B1 12/2002 Stibrany et al.
6,873,540 B2 3/2005 Krieger et al.
(Continued)

FOREIGN PATENT DOCUMENTS

JP  2004-504125   2/2004
JP  2008-53631 A  3/2008
(Continued)

OTHER PUBLICATIONS

Boping Xie et al. "Internal Reorganization Energies for Copper Redox Couples: The Slow Electron-Transfer Reactions of the $[Cu^{II/I}(bib)_2]^{2+/+}$ Couple", Inorg. Chem. vol. 38, 1999, 4 pages.

*Primary Examiner* — Seahvosh Nikmanesh
(74) *Attorney, Agent, or Firm* — Oblon, McClelland, Maier & Neustadt, L.L.P.

(57) ABSTRACT

A semiconductor memory device according to an embodiment includes a semiconductor layer, a control gate electrode, and an organic molecular layer provided between the semiconductor layer and the control gate electrode, and the organic molecular layer having an organic molecule that
(Continued)

includes a molecular structure described by a molecular formula (1):

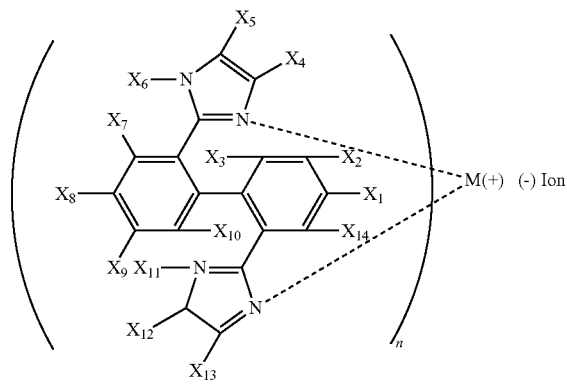

15 Claims, 11 Drawing Sheets

(51) Int. Cl.
*H01L 29/51* (2006.01)
*H01L 27/11582* (2017.01)
*H01L 51/00* (2006.01)
*H01L 27/28* (2006.01)
*H01L 51/05* (2006.01)

(52) U.S. Cl.
CPC .......... *H01L 27/281* (2013.01); *H01L 27/285* (2013.01); *H01L 51/052* (2013.01)

(56) References Cited

U.S. PATENT DOCUMENTS

| | | | |
|---|---|---|---|
| 8,962,366 B2* | 2/2015 | Putnam | G01N 27/414 438/49 |
| 9,047,941 B2 | 6/2015 | Nishizawa et al. | |
| 9,054,324 B2 | 6/2015 | Nishizawa et al. | |
| 9,378,962 B2 | 6/2016 | Hattori et al. | |
| 9,548,373 B2* | 1/2017 | Hattori | H01L 29/518 |
| 9,671,363 B2* | 6/2017 | Fife | G01N 27/414 |
| 2004/0120180 A1 | 6/2004 | Rotenberg et al. | |
| 2005/0270822 A1 | 12/2005 | Shrivastava et al. | |
| 2008/0083921 A1 | 4/2008 | Yasue et al. | |
| 2008/0191256 A1* | 8/2008 | Bidan | B82Y 10/00 257/298 |
| 2010/0163108 A1 | 7/2010 | Bessho et al. | |
| 2010/0253208 A1 | 10/2010 | Cheng et al. | |
| 2012/0112171 A1 | 5/2012 | Hattori et al. | |
| 2012/0241713 A1 | 9/2012 | Nishizawa et al. | |
| 2013/0146858 A1 | 6/2013 | Meyer-Friedrichsen et al. | |
| 2013/0242670 A1 | 9/2013 | Hattori et al. | |
| 2013/0248962 A1 | 9/2013 | Morota et al. | |
| 2014/0008601 A1 | 1/2014 | Nishizawa et al. | |
| 2014/0061762 A1 | 3/2014 | Terai et al. | |
| 2015/0214377 A1* | 7/2015 | Ito | H01L 29/7869 257/43 |
| 2015/0228335 A1 | 8/2015 | Nishizawa et al. | |
| 2015/0236171 A1 | 8/2015 | Nishizawa et al. | |

FOREIGN PATENT DOCUMENTS

| | | |
|---|---|---|
| JP | 2008-091930 | 4/2008 |
| JP | 2009-81444 | 4/2009 |
| JP | 2012-104675 | 5/2012 |
| JP | 2012-204433 | 10/2012 |
| JP | 2012-204434 | 10/2012 |
| JP | 2013-197268 | 9/2013 |
| JP | 2013-197269 | 9/2013 |
| JP | 2013-197363 | 9/2013 |
| JP | 2013-534213 | 9/2013 |

* cited by examiner

MEMORY CELL

SEMICONDUCTOR MEMORY DEVICE

CROSS-REFERENCE TO RELATED APPLICATION

This application is based upon and claims the benefit of priority from Japanese Patent Application No. 2015-060237, filed on Mar. 24, 2015, the entire contents of which are incorporated herein by reference.

FIELD

Embodiments described herein relate generally to a semiconductor memory device.

BACKGROUND

As a method of realizing low bit cost of a semiconductor memory device and enhancing memory performance thereof, a method of scaling down a size of a memory cell is widely accepted. However, scaling down the memory cell is getting technically difficult.

Hence it has been proposed to use organic molecules for a charge storage layer. The organic molecule can organically synthesize a variety of molecular structures and substituent groups. It can thus provide desired electrochemical properties. And constitutional unit of the organic molecule is small, thereby making it possible to realize scaling-down of the memory cell.

In a semiconductor memory device using organic molecules for a charge storage layer, further improvement in charge retention properties is required.

DETAILED DESCRIPTION

Figure 1:
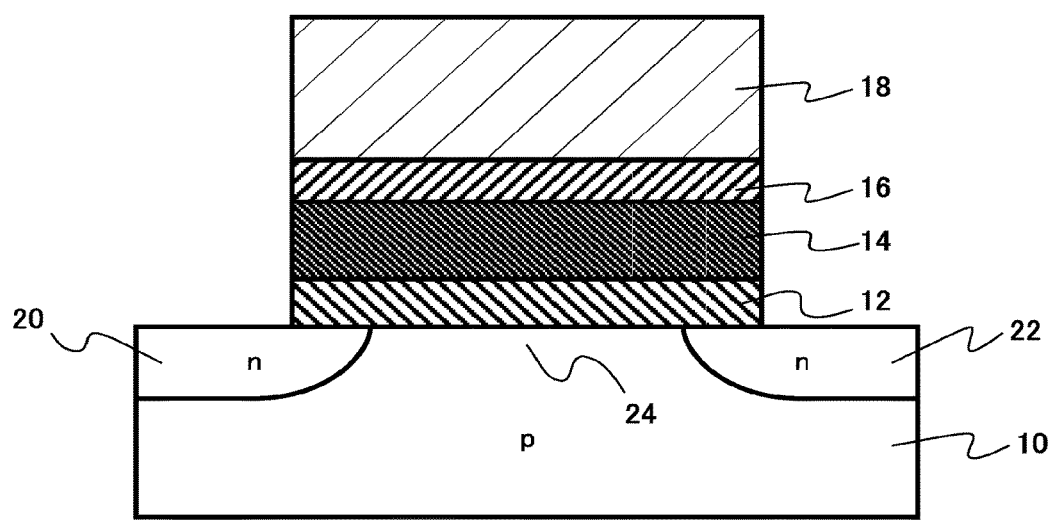
FIG. 1 is a sectional view of a memory cell unit of a semiconductor memory device according to a first embodiment.

A semiconductor memory device according to an embodiment includes: a semiconductor layer; a control gate electrode; and an organic molecular layer provided between the semiconductor layer and the control gate electrode, the organic molecular layer having an organic molecule including a molecular structure described by a molecular formula (1):

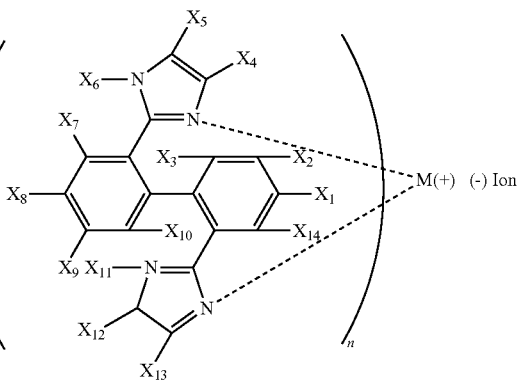

(1)

$M(+)$ in the molecular formula (1) is a positively charged metal ion selected from the group consisting of a copper ion, an iron ion, a ruthenium ion, a cobalt ion, an iridium ion, a manganese ion, a vanadium ion, a titanium ion, a zirconium ion, a silver ion, and a platinum ion. And n is an integer that is 1 or larger and changes in accordance with a kind of the metal ion. $X_1$ to $X_{14}$ are a chemical structure. And $(-)$Ion is a negatively charged ion selected from the group consisting of a chlorine ion, a bromine ion, a triflate ion, a perchlorate ion, a hexafluorophosphorus ion and a tetrafluoroboron ion.

In the present specification, the same numeral is added to the same or similar members, and a repeated description may be omitted.

In the present specification, "upper" and "lower" are used for indicating the relative positional relation of components and the like. In the present specification, concepts of "upper" and "lower" are not necessarily terms indicating the relation with the gravity direction.

Hereinafter, embodiments will be described with reference to the drawings.

First Embodiment

A semiconductor memory device according to the present embodiment includes a semiconductor layer, a control gate electrode, and an organic molecular layer provided between the semiconductor layer and the control gate electrode, the organic molecular layer having an organic molecule including a molecular structure described by a molecular formula (1).

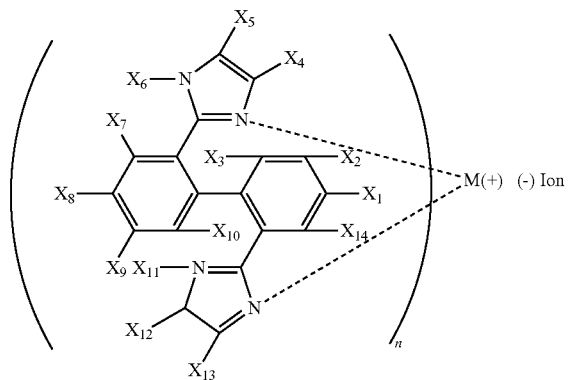

(1)

M(+) in the molecular formula (1) is a positively charged metal ion selected from the group consisting of a copper ion, an iron ion, a ruthenium ion, a cobalt ion, an iridium ion, a manganese ion, a vanadium ion, a titanium ion, a zirconium ion, a silver ion, and a platinum ion. And n is an integer that is 1 or larger and changes in accordance with a kind of the metal ion. $X_1$ to $X_{14}$ are a chemical structure. And (−)Ion is a negatively charged ion selected from the group consisting of a chlorine ion, a bromine ion, a triflate ion, a perchlorate ion, a hexafluorophosphorus ion and a tetrafluoroboron ion.

The semiconductor memory device according to the present embodiment further includes a tunnel insulating film provided between the semiconductor layer and the organic monomolecular layer, and a block insulating film provided between the organic molecular layer and the control gate electrode.

The semiconductor memory device according to the present embodiment is provided with an organic molecular layer to serve as a charge storage layer between the tunnel insulating film and the block insulating film. A molecular structure of the organic molecule constituting the organic molecular layer contains ion-pair compound. The ion-pair compound has an ion-pair structure made up of a positively charged metal complex molecule unit and a negatively charged counter ion.

By having the above configuration, the semiconductor memory device according to the present embodiment realizes two stable states, a state where the metal complex molecule unit holds an electron, and a state where it does not hold an electron. Hence electrons are stably held in the charge storage layer. This leads to improvement in charge retention properties (data retention properties) of a memory cell.

Figure 2:
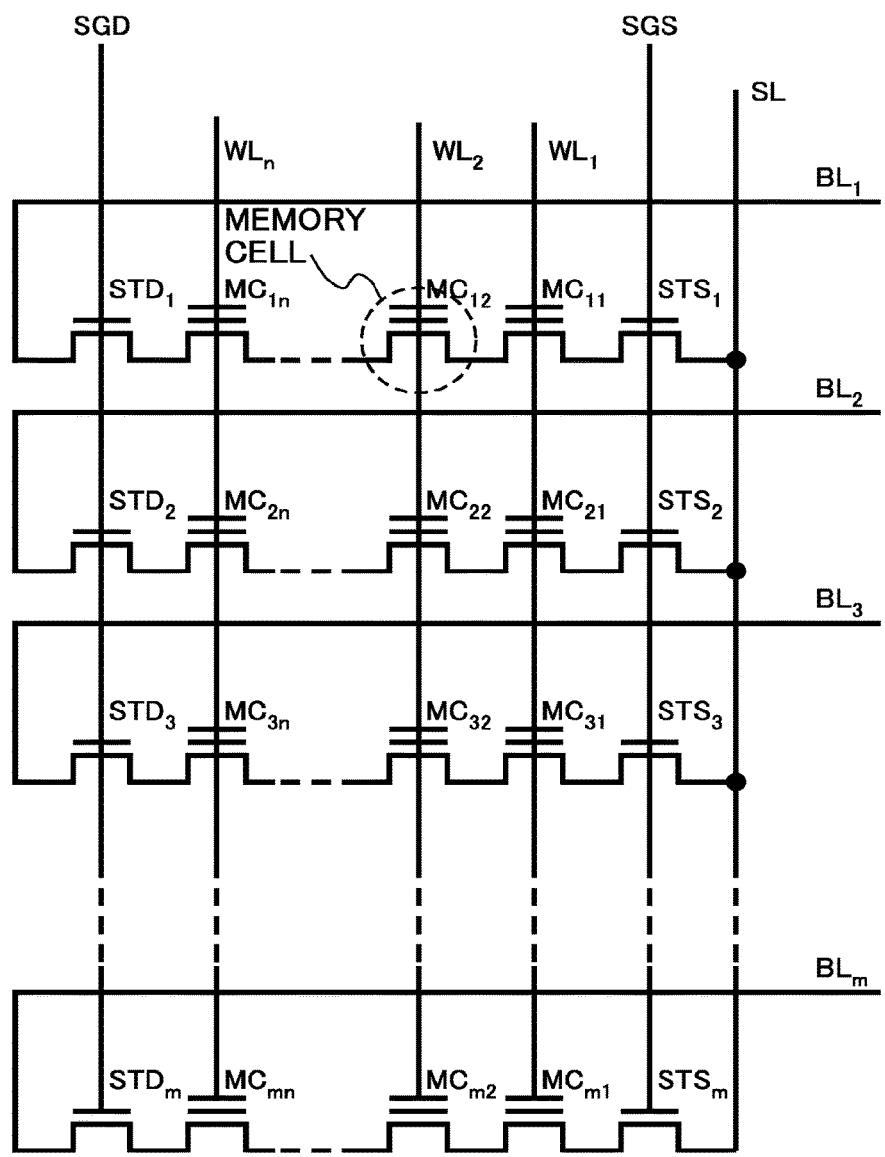
FIG. 2 is a circuit diagram of a memory cell array of the semiconductor memory device according to the first embodiment.

FIG. 1 is a sectional view of a memory cell unit of a semiconductor memory device according to the present embodiment. FIG. 2 is a circuit diagram of a memory cell array of the semiconductor memory device according to the present embodiment. The semiconductor memory device according to the present embodiment is a NAND nonvolatile semiconductor memory device.

As shown in FIG. 2, for example, the memory cell array is made up of memory cell transistors $MC_{11}$ to $MC_{1n}$, $MC_{21}$ to $MC_{2n}$, . . . , and $MC_{m1}$ to $MC_{mn}$, which are m×n (m and n are integers) transistors having a floating-gate structure. In the memory cell array, these memory cell transistors are arrayed in a column direction and in a row direction, and a plurality of memory cell transistors are thereby disposed in a matrix form.

In the memory cell array, for example, the memory cell transistors $MC_{11}$ to $MC_{1n}$ and select gate transistors $STS_1$ and $STD_1$ are serially connected, to form a NAND string (memory string) that is a cell unit.

A drain region of the select gate transistor $STS_1$ for selecting the memory cell transistors $MC_{11}$ to $MC_{1n}$ is connected to a source region of the memory cell transistor $MC_{11}$ located at the end of the array of the serially connected group of the memory cell transistors $MC_{11}$ to $MC_{1n}$. Further, a source region of the select gate transistor $STD_1$ for selecting the memory cell transistors $MC_{11}$ to $MC_{1n}$ is connected to a drain region of the memory cell transistor $MC_{1n}$ located at the end of the array of the serially connected group of the memory cell transistors $MC_{11}$ to $MC_{1n}$.

Select gate transistors $STS_2$ to $STS_m$, memory cell transistors $MC_{21}$ to $MC_{2n}$, . . . , and $MC_{m1}$ to $MC_{mn}$, and select gate transistors $STD_2$ to $STD_m$ are also serially connected respectively, to constitute NAND strings.

A common source line SL is connected to the sources of the select gate transistors $STS_1$ to $STS_m$. The memory cell transistors $MC_{11}$, $MC_{21}$, . . . , and $MC_{m1}$, the memory cell transistors $MC_{12}$, $MC_{22}$, . . . , and $MC_{m2}$, . . . and the memory cell transistors $MC_{1n}$, $MC_{2n}$, . . . , and $MC_{mn}$ are respectively connected by word lines $WL_1$ to $WL_n$ configured to control operating voltages to be applied to the control gate electrodes.

Further, a common select gate line SGS for the select gate transistors $STS_1$ to $STS_m$ and a common select gate line SGD for the select gate transistors $STD_1$ to $STD_m$ are provided.

It is to be noted that a peripheral circuit, not shown and configured to control the memory cell array of FIG. 2, is formed on the periphery of the memory cell array.

FIG. 1 shows a cross section of a memory cell in the memory cell array shown in FIG. 2, e.g., a memory cell surrounded by a dotted line in FIG. 2. In the present embodiment, a description will be given by taking as an example a case where a transistor of the memory cell is an n-type transistor having electrons as carriers.

The memory cell is formed, for example, on a p-type silicon semiconductor layer 10 containing p-type impurities. The memory cell includes a tunnel insulating film 12 on the silicon semiconductor layer 10, an organic molecular layer (charge storage layer) 14 on the tunnel insulating film 12, a block insulating film 16 on the charge storage layer 14, and a control gate electrode 18 on the block insulating film 16. A source region 20 and a drain region 22 are formed in the semiconductor layer 10 on both sides of the control gate electrode 18. A region below the control gate electrode 18 in the semiconductor layer 10 is a channel region 24. The channel region 24 is interposed between the source region 20 and the drain region 22.

The charge storage layer 14 has a function to actively store charges as memory cell information. The tunnel insulating film 12 functions as an electron/hole transfer pathway between the channel region 24 in the semiconductor layer 10 and the charge storage layer 14 through a tunneling phenomenon at the time of performing writing or erasing on the memory cell. The tunnel insulating film 12 has a function to suppress transfer of electrons and holes between the channel region 24 and the charge storage layer 14 due to a barrier height of the tunnel insulating film 12 at the time of performing reading or waiting. The block insulating film 16 is a so-called interelectrode insulating film, and has a function to block flows of electrons and holes between the charge storage layer 14 and the control gate electrode 18.

To the semiconductor layer 10, silicon germanide, germanium, a compound semiconductor or the like can also be applied other than silicon.

The tunnel insulating film 12 is a silicon oxide ($SiO_2$) film, for example. A material for the tunnel insulating film 12 is not restricted to exemplified silicon oxide, but another insulating film made of aluminum oxide or the like can be applied as appropriate.

The thicker the tunnel insulating film 12 is, the higher the insulation properties and the more hardly the stored charge escapes. However, when it is excessively thick, the semiconductor memory device has a large film thickness itself, which is not desirable. Hence, the tunnel insulating film 12 desirably has a thickness of 10 nm or smaller, and more desirably has a thickness of 5 nm or smaller. It is to be noted that the foregoing thicknesses are all physical film thicknesses.

The tunnel insulating film 12 may be a stacked film. For example, materials can be stacked in order to promote chemical adsorption of the organic molecules constituting the organic molecular layer 14 to the surface of the tunnel insulating film. For example, a stacked film of a silicon oxide film and an aluminum oxide film is applicable.

The charge storage layer 14 is made up of a monomolecular film, for example. The charge storage layer 14 is desirably a monomolecular film from the viewpoints of scaling down the memory cell and stabilizing the properties. The charge storage layer 14 desirably has a thickness of 20 nm or smaller from the viewpoint of scaling down the memory cell.

The block insulating film 16 is a metal oxide such as hafnium oxide ($HfO_2$). For the block insulating film 16, other than hafnium oxide described above, a metal oxide such as aluminum oxide ($Al_2O_3$), silicon oxide, zirconium oxide or titanium oxide is used.

The thicker the block insulating film 16, the higher the insulation properties and the more hardly the stored charge escapes. However, when it is excessively thick, the semiconductor memory device has a large film thickness itself, which is not desirable. Hence, the block insulating film 16 desirably has a thickness of 10 nm or smaller, and more desirably has a thickness of 5 nm or smaller.

The block insulating film 16 may be either a single-layer film or a stacked film. The block insulating film 16 is, for example, a metal oxide film formed by ALD (Atomic Layer Deposition).

The control gate electrode 18 is, for example, polycrystalline silicon imparted with conductivity by introducing impurities. For the control gate electrode 18, any conductive material can be used. For the control gate electrode 18, other than the polycrystalline silicon described above, amorphous silicon imparted with conductivity by introducing impurities, or the like, can be used. Further, for the control gate electrode 18, metal, an alloy, a metal semiconductor compound or the like may be used.

The source region 20 and the drain region 22 are formed, for example, of n-type diffusion layers containing n-type impurities.

Figure 3:
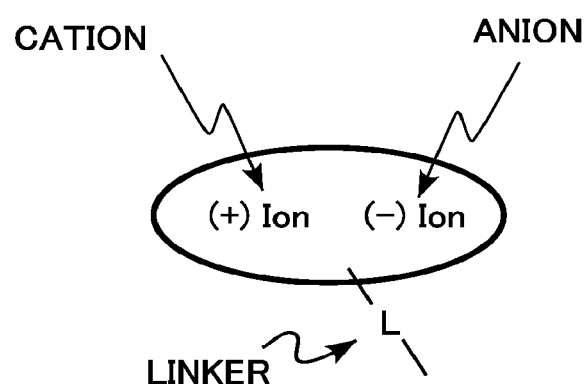
FIG. 3 is an explanatory diagram of an organic molecule of the first embodiment.

FIG. 3 is an explanatory diagram of an organic molecule of the present embodiment. The organic molecule of the present embodiment contains an ion-pair compound having an ion-pair structure of a cation (((+)Ion) in FIG. 3) and an anion (((−)Ion) in FIG. 3). The organic molecule of the present embodiment is provided with a metal complex molecule unit as a cation. Further, it is provided with a counter ion, configured to cancel a charge of the metal complex molecule unit and hold an electrically neutral state, as an anion.

The organic molecule of the present embodiment contains a chemically modified group called a linker (L in FIG. 3). The organic molecule may be chemically bonded to the semiconductor layer 10 side or the control gate electrode 18 side via a linker. In other word, the organic molecule may be chemically bonded to a region close to the semiconductor layer or a region close to the control gate electrode via a linker.

Examples of the linker include an ether group, a silyl ether group, a dimethylsilyl ether group, a diethylsilyl ether group, a carboxy ester group, a sulfonyl ester group, a phosphonic acid ester group, an amide group, a thioether group, and the like. Since the easiness for the linker to perform bonding formation varies depending on a material to bond, a chemical structure of the optimal linker varies depending on the material to bond. For a semiconductor material or an insulating film of a metal oxide or the like, for example, an ether group, a silyl ether group, a dimethylsilyl ether group, a diethylsilyl ether group, a carboxy ester group, a sulfonyl ester group, a phosphonic acid ester group, an amide group or the like is desirable. From the viewpoints of easiness in organic synthesis and chemical reactivity with a metal oxide, the silyl ether group, the dimethylsilyl ether group, the diethylsilyl ether group and the phosphonic acid ester group are desired. Especially when the metal oxide is aluminum oxide, the phosphonic acid ester is more desired. Further, the linker may contain in its structure an alkyl group, a phenyl group or the like to serve as a spacer.

The organic molecule layer 14 of the present embodiment includes a molecular structure described by the following molecular formula (1):

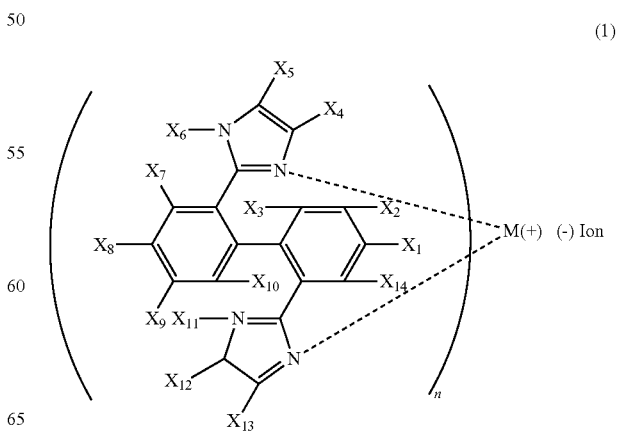

(1)

M(+) in the molecular formula (1) is a positively charged metal ion selected from the group consisting of a copper ion, an iron ion, a ruthenium ion, a cobalt ion, an iridium ion, a manganese ion, a vanadium ion, a titanium ion, a zirconium ion, a silver ion, and a platinum ion. And n is an integer that is 1 or larger and changes in accordance with a kind of the metal ion. And at least one of $X_1$ to $X_{14}$ is a chemically modified group for chemically bonding the organic molecule to the semiconductor layer side or the control gate electrode side. And (−)Ion is a negatively charged ion selected from the group consisting of a chlorine ion, a bromine ion, a triflate ion, a perchlorate ion, a hexafluorophosphorus ion and a tetrafluoroboron ion.

As shown by the molecular formula (1), M(+) is a positively charged metal ion selected from the group consisting of a copper ion, an iron ion, a ruthenium ion, a cobalt ion, an iridium ion, a manganese ion, a vanadium ion, a titanium ion, a zirconium ion, a silver ion, and a platinum ion. That is, the metal complex molecule unit is a copper complex, an iron complex, a ruthenium complex, a cobalt complex, an iridium complex, a manganese complex, a vanadium complex, a titanium complex, a zirconium complex, a silver ion or a platinum ion. In the molecular formula (1), n is an integer that is 1 or larger and changes in accordance with a kind of the metal ion.

A ligand of the metal complex molecule unit is has a molecular structure named bis(imidazole)biphenyl as shown by the molecular formula (1). Bis(imidazole)biphenyl has excellent thermal resistance.

As shown by the molecular formula (1), the counter ion is a chlorine ion, a bromine ion, a triflate ion, a perchlorate ion, a hexafluorophosphorus ion or a tetrafluoroboron ion.

In the molecular formula (1), at least any one of $X_1$ to $X_{14}$ is a linker. There may be two or more linkers.

For example, $X_1$ to $X_{14}$ in the molecular formula (1) are a chemical structure having a chemically modified group containing a chemical group selected from the group consisting of an ether group, a silyl ether group, a dimethylsilyl ether group, a diethylsilyl ether group, a carboxy ester group, a sulfonyl ester group, a phosphonic acid ester group, an amide group, a thioether group, an ether group, and a thioester group, or $X_1$ to $X_{14}$ in the molecular formula (1) are a chemical structure selected from the group consisting of a hydroxyl group, a hydroxysilyl group, a trimethoxysilyl group, a diethylmethoxysilyl group, a triethoxysilyl group, a dimethylethoxysilyl group, a diethylethoxysilyl group, a trichlorosilyl group, a dimethylchlorosilyl group, a diethylchlorosilyl group, phosphonic acid, sulfonic acid, amino acid, a carboxyl group, a thiol group, an alkyl group consisting of hydrocarbon, a halogen group, and hydrogen. And $X_1$ to $X_{14}$ are the same or different. But, at least one of $X_1$ to $X_{14}$ is a chemically modified group containing a chemical group selected from the group consisting of an ether group, a silyl ether group, a dimethylsilyl ether group, a diethylsilyl ether group, a carboxy ester group, a sulfonyl ester group, a phosphonic acid ester group, an amide group, a thioether group, an ether group, and a thioester group.

In the molecule of the molecular formula (1), a metal ion of the metal complex molecule unit receives an electron, or releases it, to cause a change in molecular structure. By the metal ion receiving an electron or releasing it, rearrangement of dipoles occurs. This leads to existence of two stable states, a state where the metal complex molecule unit holds an electron, and a state where it does not hold an electron. Further, by the metal ion accepting an electron or releasing it, a counter ion is also re-disposed in such a direction as to stabilizing the two states. This further stabilizes the two states.

In particular, a bis(imidazole)biphenyl body in the molecular formula (1) causes occurrence of a steric hindrance, and hence a conformation of the ligand hardly changes. This lowers an electron self-exchange rate of the metal complex molecule unit shown by the molecular formula (1), and thereby, a charge accepted by writing is hardly released. That a charge is hardly released means longer memory time of the non-volatile semiconductor memory device, and better data retention properties thereof. It is thus possible to realize a non-volatile semiconductor memory device with excellent charge retention properties.

The organic molecule of the present embodiment desirably includes a molecular structure described by a molecular formula (2):

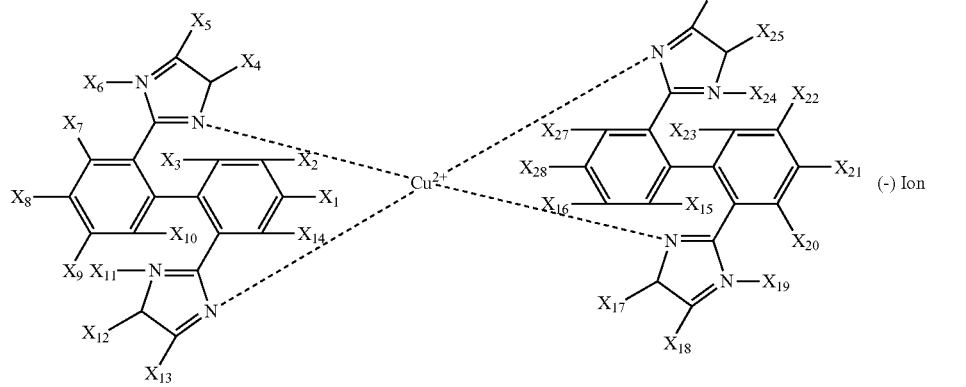

$X_1$ to $X_{28}$ in the molecular formula (2) are a chemical structure. (–)Ion is a negatively charged ion selected from the group consisting of a chlorine ion, a bromine ion, a triflate ion, a perchlorate ion, a hexafluorophosphorus ion, and a tetrafluoroboron ion.

M(+)Ion in the molecular formula (1) is desirably a divalent copper ion. The copper ion is slow in electron self-exchange as compared to other metal ions, thereby leading to improvement in charge retention properties of the non-volatile semiconductor memory device. In the molecular formula (2), the metal complex molecule unit is a divalent positively charged copper ion.

Further, the divalent positively charged copper ion easily accepts an electron, and by accepting an electron, it is stabilized in a monovalent positively charged state of the molecular formula (2). It is to be noted that in the case of the divalent copper ion, it is stabilized in a state where two bis(imidazole)biphenyl ligands are bonded, namely a state where n=2 in the molecular formula (1).

Further, in the molecular formula (2), at least any one of $X_1$ to $X_{28}$ is a linker. There may be two or more linkers.

For example, a chemical structure is formed in which $X_1$ to $X_{28}$ in the molecular formula (2) are a chemically modified group containing a group selected from the group consisting of an ether group, a silyl ether group, a dimethylsilyl ether group, a diethylsilyl ether group, a carboxy ester group, a sulfonyl ester group, a phosphonic acid ester group, an amide group, a thioether group, an ether group, and a thioester group; or a chemical structure selected from the group consisting of a hydroxyl group, a hydroxysilyl group, a trimethoxysilyl group, a diethylmethoxysilyl group, a triethoxysilyl group, a dimethylethoxysilyl group, a diethylethoxysilyl group, a trichlorosilyl group, a dimethylchlorosilyl group, a diethylchlorosilyl group, phosphonic acid, sulfonic acid, amino acid, a carboxyl group, a thiol group, an alkyl group consisting of hydrocarbon, a halogen group, and hydrogen. $X_1$ to $X_{28}$ may be the same or different. However, at least one of $X_1$ to $X_{28}$ is a chemically modified group containing a group selected from the group consisting of an ether group, a silyl ether group, a dimethylsilyl ether group, a diethylsilyl ether group, a carboxy ester group, a sulfonyl ester group, a phosphonic acid ester group, an amide group, a thioether group, an ether group, and a thioester group.

$X_1$ to $X_5$, $X_7$ to $X_{18}$ and $X_{20}$ to $X_{28}$ are desirably hydrogen from the viewpoint of simplifying organic synthesis, and $X_6$ and $X_{19}$ are desirably linkers bonded with the substrate.

Accordingly, the organic molecule of the present embodiment desirably has a molecular structure described by a molecular formula (3):

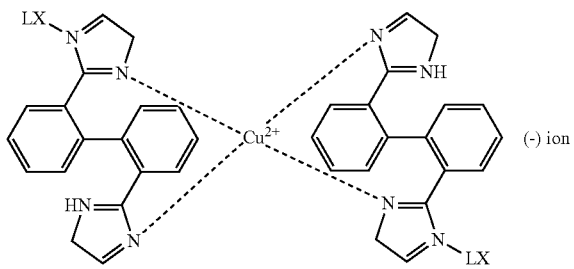

(3)

At least one of LX in the molecular formula (3) is a chemically modified group for chemically bonding the organic molecule to the semiconductor layer side or the control gate electrode side. In other word, at least one of LX in the molecular formula (3) is a chemically modified group for chemically bonding the organic molecule to a region close to the semiconductor layer or a region close to the control gate electrode. (–)Ion is a negatively charged ion selected from the group consisting of a chlorine ion, a bromine ion, a triflate ion, a perchlorate ion, a hexafluorophosphorus ion, and a tetrafluoroboron ion.

A chemical structure is formed in which LX in the molecular formula (3) is selected from a chemically modified group containing a group selected from the group consisting of an ether group, a silyl ether group, a dimethylsilyl ether group, a diethylsilyl ether group, a carboxy ester group, a sulfonyl ester group, a phosphonic acid ester group, an amide group, a thioether group, an ether group, and a thioester group; or a chemical structure selected from the group consisting of a hydroxyl group, a hydroxysilyl group, a trimethoxysilyl group, a diethylmethoxysilyl group, a triethoxysilyl group, a dimethylethoxysilyl group, a diethylethoxysilyl group, a trichlorosilyl group, a dimethylchlorosilyl group, a diethylchlorosilyl group, phosphonic acid, sulfonic acid, amino acid, a carboxyl group, a thiol group, an alkyl group consisting of hydrocarbon, a halogen group, and hydrogen. LX may be the same or different. However, at least one of LX is a chemically modified group containing a group selected from the group consisting of an ether group, a silyl ether group, a dimethylsilyl ether group, a diethylsilyl ether group, a carboxy ester group, a sulfonyl ester group, a phosphonic acid ester group, an amide group, a thioether group, an ether group, and a thioester group.

LX in the molecular formula (3) is desirably a phosphonic acid ester group due to simplicity in organic synthesis. Further, an alkyl group to act as a spacer is desirably contained. With the alkyl group being contained, an electron accepted by writing in the non-volatile semiconductor memory device is hardly released.

Accordingly, the organic molecule of the present embodiment desirably has a molecular structure described by a molecular formula (4):

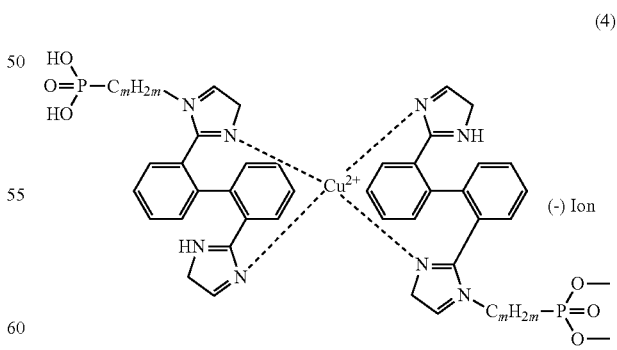

(4)

"m" in the molecular formula (4) is an integer of 0 or larger. (–)Ion is a negatively charged ion selected from the group consisting of a chlorine ion, a bromine ion, a triflate ion, a perchlorate ion, a hexafluorophosphorus ion, and a tetrafluoroboron ion.

An ion radius of (−)Ion is desirably moderately large from the viewpoint of facilitating occurrence of a change in disposition of (−)Ion, accompanied by the metal ion accepting or releasing an electron, and from the viewpoint of increasing an amount of the change in disposition. From these viewpoints, (−)Ion is desirably a triflate ion, a perchlorate ion, a hexafluorophosphorus ion, or a tetrafluoroboron ion. Further, from the viewpoint of easiness of organic synthesis, (−)Ion is desirably a perchlorate ion.

"m" in the molecular formula (4) is an integer of 0 or larger to set the length of a spacer. The bis(imidazole) biphenyl ligand is desirably distant from the substrate or the like bonded through the linker. Hence the spacer is desirably long. However, when the spacer is excessively long, organic synthesis is difficult and thermal resistance deteriorates. Therefore, "m=6" is desirable.

Accordingly, the organic molecule of the present embodiment desirably has a molecular structure described by a molecular formula (5):

organic molecule of the present embodiment desirably has molecular structures described by molecular formulas (6) and

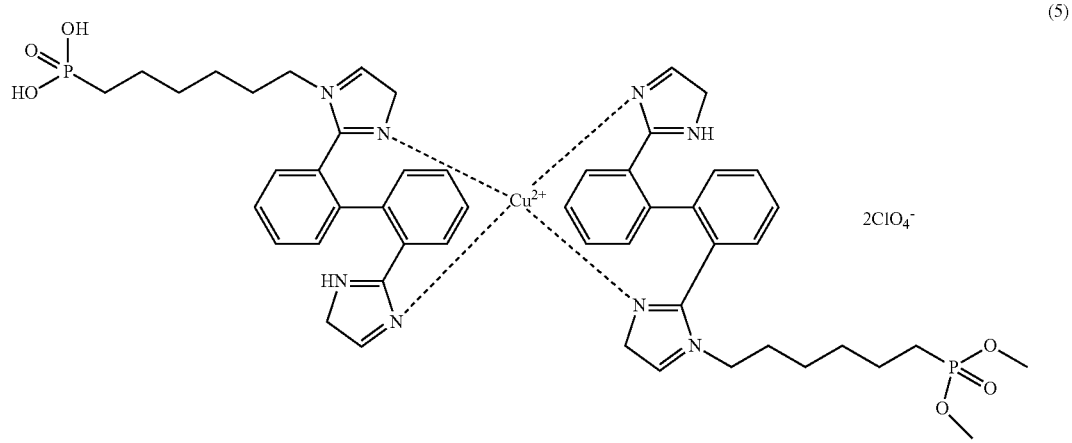

Further, the molecular formulas (4) and (5) have structures where the organic molecule takes one of the phosphonic acid ester groups as a linker. They may have structures with both of the two phosphonic acid ester groups of the organic molecule taken as linkers. From this viewpoint, the "m" in the molecular formula (6) is an integer 0 or larger. (−)Ion is a negatively charged ion selected from the group consisting of a chlorine ion, a bromine ion, a triflate ion, a perchlorate ion, a hexafluorophosphorus ion, and a tetrafluoroboron ion.

It is to be noted that, from the viewpoint of facilitating molecule synthesis, m in the molecular formulae (4) and (6) is desirably m=3. Accordingly, the organic molecule of the present embodiment desirably has a molecular structure described by molecular formulas (8) and (9).

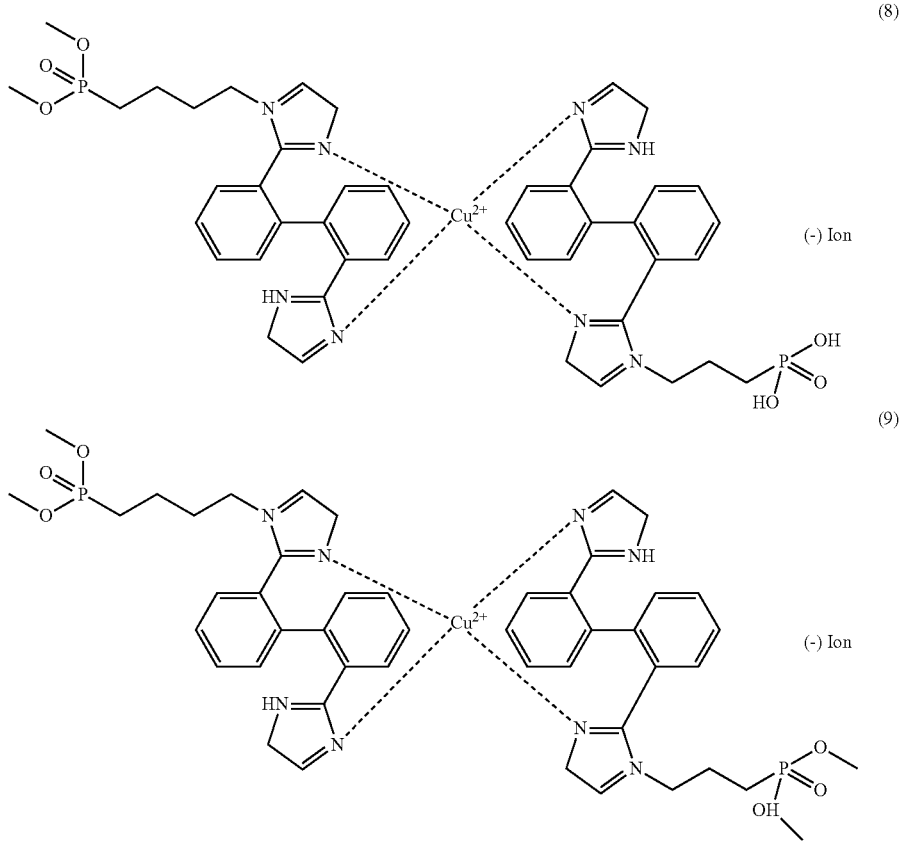

Figure 4:
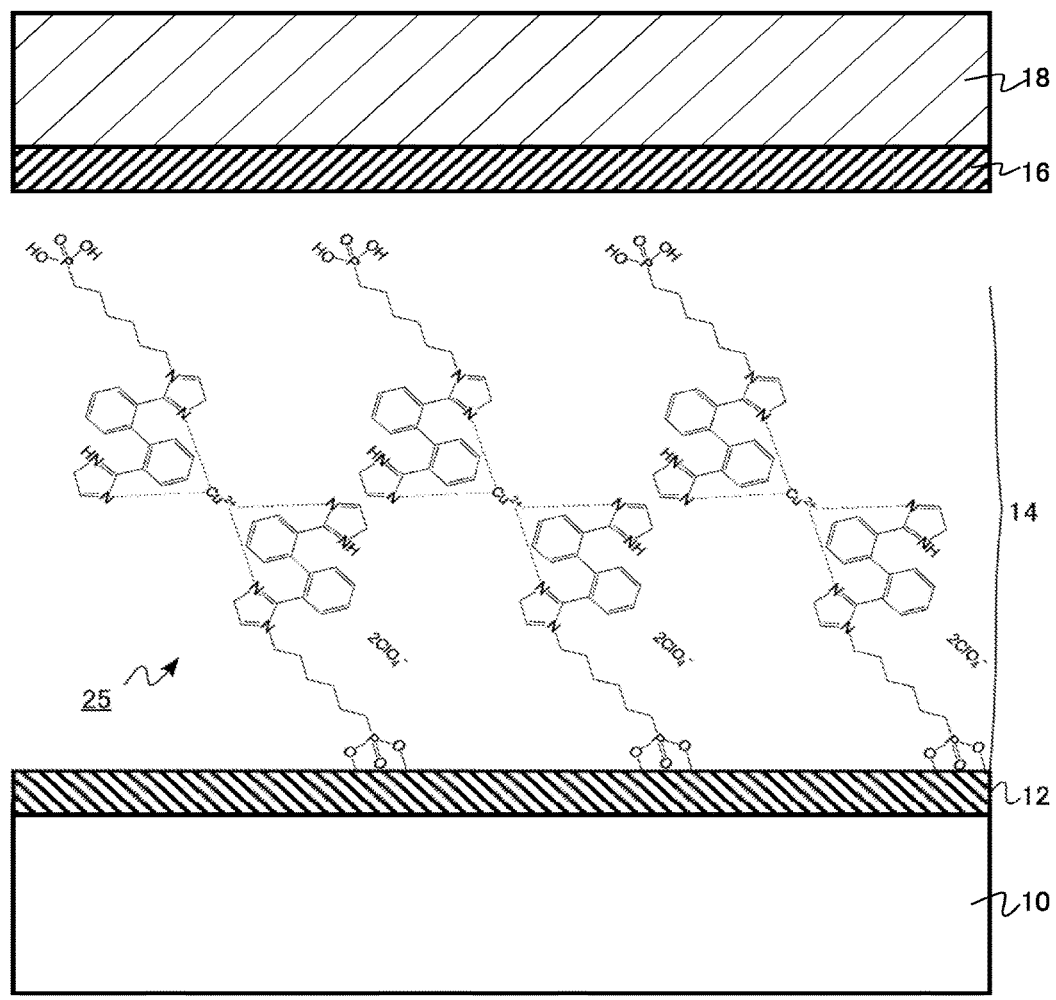
FIG. 4 is an enlarged schematic view of a memory cell unit of the semiconductor memory device according to the first embodiment.

FIG. 4 is an enlarged schematic view of one example of a memory cell unit of the semiconductor memory device according to the present embodiment. This is a view showing a detail of a structure and adsorption pattern of each of organic molecules used for the charge storage layer 14.

The charge storage layer 14 is made up of organic molecules (charge storage molecules) 25. The charge storage molecule 25 has a function to store a charge that serves as data of the memory cell. The charge storage molecule 25 of the memory cell shown in FIG. 4 has a molecular structure described by the above molecular formula (5).

The tunnel insulating film 12 is, for example, a stacked film of a silicon oxide film and an aluminum oxide film. One end of a phosphonic acid ester group as a linker of the charge storage molecule 25 is chemically bonded with the surface of the aluminum oxide film of the tunnel insulating film 12, to constitute the charge storage layer 14. The charge storage layer 14 is a monomolecular film.

The charge storage molecule 25 can be detected by the following analysis method. That is, it can be detected using a mass spectroscope (MS), a secondary ionic mass spectrometer (SIMS), a nuclear magnetic resonator (NMR), an element analyzer, infrared reflection absorption spectroscopy (IR-RAS), an X-ray fluorescence instrument (XRF), X-ray photoelectron spectroscopy (XPS), an ultraviolet-visible spectrophotometer (UV-vis), a spectrofluoro-photometer (FL), or the like.

When an insulating film of a metal oxide or the like is formed on the charge storage layer 14, the analysis is performed while the surface is ground with, for example, a sputter using argon ions or the like. Alternatively, the charge storage layer 14 is dissolved and peeled by a hydrofluoric acid aqueous solution or the like simultaneously with the insulating film of the metal oxide or the like, and the solution is analyzed.

Further, in the method for performing the analysis by grinding the surface by means of the above sputter or the like, a heating treatment may be performed as the grinding method. In this case, a gas containing the ground material may be adsorbed to another material such as an activated carbon, and the other material such as the activated carbon with the gas adsorbed thereto may be analyzed and detected. Further, in the method for peeling the material by the hydrofluoric acid aqueous solution or the like and analyzing the solution, the dissolved and peeled material may be subjected to a reduced pressure or a heating treatment to be concentrated, and may then be analyzed and detected.

At the time of performing writing operation on the memory cell according to the present embodiment, a voltage is applied between the control gate electrode 18 and the semiconductor layer 10 such that the control gate electrode 18 reaches a relatively positive voltage, to store a negative charge in the charge storage layer 14. When the control gate electrode 18 reaches a relatively positive voltage, an inversion layer is formed in the channel region 24 and electrons are stored. The electrons move in the tunnel insulating film 12, and are stored in the charge storage molecules of the charge storage layer 14.

In this state, a threshold voltage of the transistor of the memory cell is high as compared to the state of the electrons not being stored. Namely, this is a state where the transistor is hardly turned on. This is a state where data "0" has been written.

At the time of performing data erasing operation, a voltage is applied between the control gate electrode 18 and the semiconductor layer 10 such that the control gate electrode 18 reaches a relatively negative voltage. Due to an electric field between the control gate electrode 18 and the semiconductor layer 10, the electrons stored in the charge storage layer 14 transfer in the tunnel insulating film 12 and are drawn to the semiconductor layer 10.

In this state, a threshold voltage of the transistor of the memory cell reaches low as compared to the state of the data "0". Namely, this is a state where the transistor is easily turned on. This state is data "1".

At the time of reading data, a voltage is applied between the source region 20 and the drain region 22. For example, in the state of data "0" where electrons are stored, with the threshold voltage of the transistor being high, an inversion layer is not formed in the channel region 24 and a current does not flow between the source and the drain.

Meanwhile, in the erased state, namely in the state of the data "1" where charges are not stored, with the threshold voltage of the transistor being low, an inversion layer is formed in the channel region 24 and a current flows between the source and the drain. As thus described, detecting a current amount of the transistor allows reading whether the data is the data "0" or the data "1".

It should be noted that at the time of performing data verifying operation to check whether or not writing has been sufficiently performed after performing the data writing operation, a similar operation to one at the time of the reading operation is performed. A voltage is applied between the source region 20 and the drain region 22, and when a desired current does not flow, the data writing operation is performed again.

Next, a method for manufacturing the semiconductor memory device according to the present embodiment will be described.

The method for manufacturing the semiconductor memory device according to the present embodiment includes: forming the tunnel insulating film 12 on the semiconductor layer 10; forming the charge storage layer 14 on the tunnel insulating film 12; forming the block insulating film 16 on the charge storage layer 14; and forming the control gate electrode 18 on the block insulating film 16.

For example, the tunnel insulating film 12 is formed on the semiconductor layer 10 of single crystal silicon. When the tunnel insulating film 12 is silicon oxide, it can be formed, for example, by introducing a silicon substrate into a thermal oxidization furnace for forced oxidation.

Further, the tunnel insulating film 12 can also be formed by means of a film forming device for ALD, CVD, sputtering or the like. In the case of film formation, it is desirable to anneal the insulating film after the film formation, by means of a Rapid Thermal Annealing (RTA) device.

Subsequently, the charge storage layer 14 is formed on the tunnel insulating film 12.

In the case of forming the charge storage layer 14, for example, the following methods are applicable.

First, the surface of the tunnel insulating film 12 to be a foundation for forming the charge storage layer 14 is cleaned. For this cleaning, it is possible to employ, for example, cleaning by means of a mixed solution of sulfuric acid and hydrogen peroxide solution (a mixed ratio is 2:1, for example), or a UV cleaning by irradiating the insulating film surface with ultraviolet light.

Next, the charge storage molecule 25 having the molecular structure of the molecular formula (1) is prepared. The cleaned surface of the tunnel insulating film 12 is soaked into a solution obtained by dissolving the charge storage molecule 25 in the state before bonding to the foundation into a solvent. Then, the linker of the charge storage molecule 25 is reacted with the surface of the tunnel insulating film 12.

The charge storage molecule 25 in the state before bonding to the foundation is a hydrogenated body, a halogenated body, a methoxy body, an ethoxy body or the like before the linker of the charge storage molecule 25 is bonded to the foundation. Examples of the charge storage molecule 25 include a hydroxy group, a trimethoxysilyl group, a dimethylmethoxysilyl group, a diethylmethoxysilyl group, a triethoxysilyl group, a dimethylethoxysilyl group, a diethylethoxysilyl group, a trichlorosilyl group, dimethylchlorosilyl group, a diethylchlorosilyl group, a carboxy group, a sulfonyl group, a phosphonate group, a methylphosphonate ester group, an ethylphosphonic acid ester group, an amino group and a thiol group.

As the solvent, it is conceivable that one with high solubility of the charge storage molecule 25 is used, and water and organic solvents such as acetone, toluene, ethanol, methanol, hexane, cyclohexanone, benzene, chlorobenzene, xylene, tetrahydrofuran, dimethylsulfoxide, N,N-dimethylformamide, anisole, cyclohexanone, methoxypropionic acid methyl, acetonitrile, and benzonitrile are applicable. In some cases, some charge storage molecules 25 are dissolved into water, and in those cases, water can be used as a solvent. Further, a mixture of these solvents can also be used as a solvent.

When the concentration of the charge storage molecule 25 to be dissolved into the solvent is excessively low, the reaction time requires a long time. When it is excessively high, unnecessary adsorption molecules which need removing by rinsing operation increase. Hence the concentration is desirably set to an appropriate one. The concentration is desirably set to from about 0.1 mM to 100 mM, for example.

Further, at this time, a catalyst may be added for the purpose of increasing the reactivity between the cleaned surface of the tunnel insulating film and the organic material. As the catalyst, acetic acid, formic acid, propionic acid, trifluoroacetic acid, triethylamine and ammonia which can be dissolved in the solvent are used. When the amount of the catalyst added is excessively large, the organic material is self-reacted in the solvent causing a side reaction such as polymerization, and hence the amount is desirably made small. It is desirably 3% or less with respect to a volume of the solution.

The time for soaking the surface of the insulating film into the solution of the charge storage molecule 25 is desirably the extent of the time for occurrence of a sufficient reaction, and specifically, one minute or longer is desirably taken.

The surface is then soaked into the used solvent, and rinsed using an ultrasonic cleaner. In order to rinse the unnecessarily physically adsorbed organic material, this operation is desirably performed at least twice or more, with the solvent being replaced by a new one.

Subsequently, the surface is soaked into ethanol, and rinsed using the ultrasonic cleaner similarly to the above.

The solvent is then removed by a nitride air gun, a spin coater or the like, and drying is performed. Thereby, the charge storage layer 14 made up of the charge storage molecules 25 is formed on the tunnel insulating film 12. The charge storage layer 14 becomes a monomolecular film due to self-assembling of the charge storage molecule 25.

Thereafter, for example, a hafnium oxide film is deposited on the charge storage layer 14, to form the block insulating film 16.

The block insulating film 16 can be formed by means of a film forming device for ALD (Atomic Layer Deposition), CVD (Chemical Vapor Deposition), sputtering or the like. There is desirably used a film forming device with which the charge storage layer 14 formed of the organic molecules is not disassembled and a damage is small, and for example, a thermal ALD device is desirable. When the insulating film after the film formation is annealed using the RTA device, an atomic density in the film increases, which is desirable.

An impurity-doped polycrystalline silicon film is then formed by CVD (Chemical Vapor Deposition), for example, to form the control gate electrode 18. The stacked films are then patterned, thereby to form a gate electrode structure.

Subsequently, for example, n-type impurities are ion-implanted using the control gate electrode 18 as a mask, to form the source region 20 and the drain region 22. In such a manner, it is possible to manufacture the semiconductor memory device shown in FIG. 1.

As above, according to the present embodiment, the charge storage molecule 25 having the molecular structure of the molecular formula (1) is used for the charge storage layer 14, thereby to allow realization of a semiconductor memory device that accomplishes excellent charge retention properties.

Second Embodiment

A semiconductor memory device according to the present embodiment differs from the first embodiment in that the tunnel insulating film is not provided and the charge storage layer has the function of the tunnel insulating film. Hereinafter, descriptions of contents that overlap with those of the first embodiment will be omitted.

Figure 5:
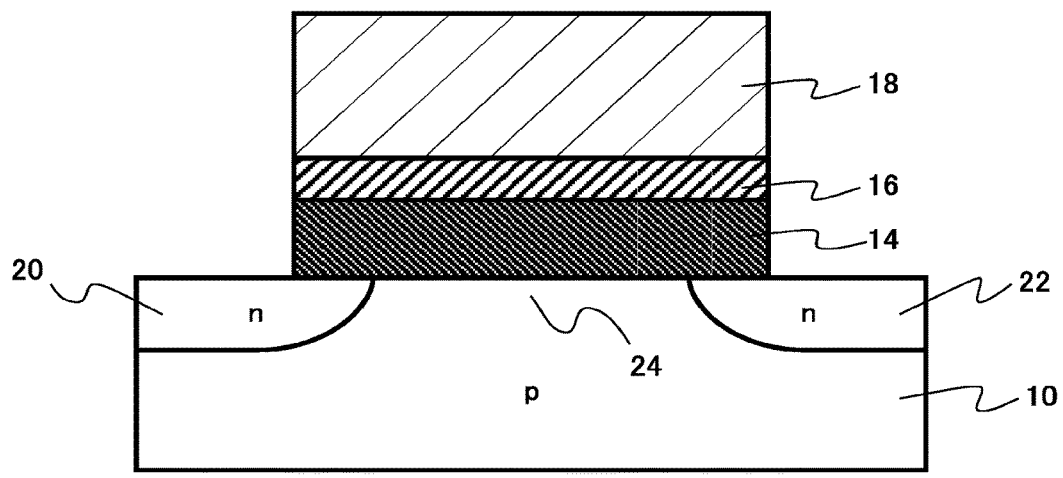
FIG. 5 is a sectional view of a memory cell unit of a semiconductor memory device according to a second embodiment.

FIG. 5 is a sectional view of a memory cell unit of the semiconductor memory device according to the present embodiment.

The memory cell is formed, for example, on the n-type silicon semiconductor layer 10 containing n-type impurities. The memory cell includes the charge storage layer 14 on the silicon semiconductor layer 10, the block insulating film 16 on the charge storage layer 14, and the control gate electrode 18 on the block insulating film 16. The source region 20 and the drain region 22 are formed in the semiconductor layer 10 on both sides of the control gate electrode 18. A region below the control gate electrode 18 in the semiconductor layer 10 is the channel region 24. The channel region 24 is interposed between the source region 20 and the drain region 22.

In the present embodiment, the charge storage molecule in the charge storage layer 14 also has the function of the tunnel insulating film. In the present embodiment, the charge storage molecule 25 is directly chemically bonded to the semiconductor layer 10.

Similarly to the first embodiment, the charge storage molecule 25 has a function to store charges that serve as data of the memory cell.

The linker of the charge storage molecule 25 includes an alkyl chain, and a function to hold insulation properties with the semiconductor layer 10 is expressed by the alkyl chain of the linker. For example in the above molecular formula (4) or (6), the charge storage molecule 25 has an alkyl chain with a carbon number (m) of an alkyl chain portion of 6 or larger and not larger than 30.

The carbon number of the alkyl chain is 6 or larger and not larger than 30, and is more desirably 6 or larger and 20 or smaller. This is because, when the carbon number is below the above range, the effect of enhancing the insulation properties cannot be obtained. Further, when the carbon number exceeds the above range, the film thickness might become larger to make the scaling-down difficult. However, from the viewpoint of simplicity, the carbon number of the alkyl chain may be not larger than 6.

The method for manufacturing the semiconductor device according to the present embodiment includes: forming the charge storage layer 14 that contains the charge storage molecules 25 having the molecular structure of the molecular formula (4) or (6) on the semiconductor layer 10 by self-assembling; forming the block insulating film 16 on the charge storage layer 14; and forming the control gate electrode 18 on the block insulating film 16.

For example, the charge storage layer 14 is formed on the semiconductor layer (semiconductor substrate) 10 of single crystal silicon by self-assembling.

This is similar to the first embodiment except that the charge storage layer 14 is directly formed on the semiconductor layer 10.

According to the present embodiment, similarly to the first embodiment, it is possible to realize a semiconductor memory device that accomplishes excellent charge retention properties. Further, in place of the tunnel insulating film of an inorganic material such as an oxide, the charge storage layer 14 realizes the function of the tunnel insulating film. Therefore, the physical film thickness of the memory cell structure can be made small. This leads to realization of a semiconductor memory device provided with a finer memory cell. Further, eliminating the need for formation of the tunnel insulating film of the inorganic material can simplify the manufacturing process.

In addition, for example, it is possible to give the function of the block insulating film to the organic molecular layer 14 by further providing an alkyl chain or the like on the control gate electrode 18 side of the charge storage molecule 25 of the charge storage layer 14, so as to form a configuration where the block insulating film 16 of an inorganic material such as an oxide is omitted.

Third Embodiment

A semiconductor memory device according to the present embodiment is similar to the first embodiment except that a conductive layer is formed between the tunnel insulating film and the charge storage layer. Hereinafter, descriptions of contents that overlap with those of the first embodiment will be omitted.

Figure 6:
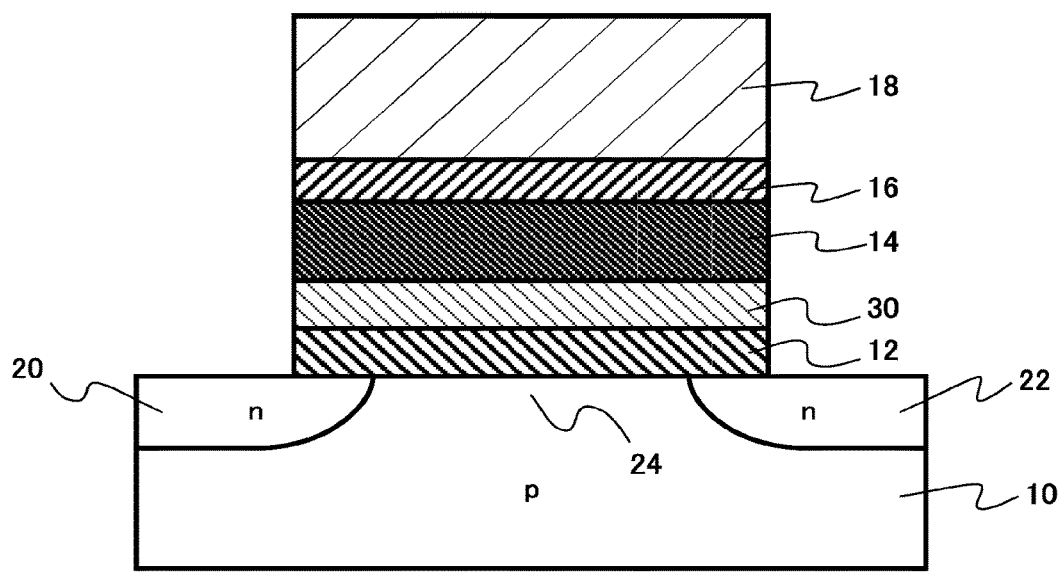
FIG. 6 is a sectional view of a memory cell unit of a semiconductor memory device according to a third embodiment.

FIG. 6 is a sectional view of a memory cell unit of the semiconductor memory device according to the present embodiment.

The memory cell is formed, for example, on a p-type silicon semiconductor layer 10 containing p-type impurities. Then, the tunnel insulating film 12 is provided on the silicon semiconductor layer 10, a conductive layer 30 is provided on the tunnel insulating film 12, the charge storage layer 14 is provided on the conductive layer 30, the block insulating film 16 is provided on the charge storage layer 14, and the control gate electrode 18 is provided on the block insulating film 16. A source region 20 and a drain region 22 are formed in the semiconductor layer 10 on both sides of the control gate electrode 18. A region below the control gate electrode 18 in the semiconductor layer 10 is a channel region 24. The channel region 24 is interposed between the source region 20 and the drain region 22.

The conductive layer 30 has a function to uniformly disperse a charge stored in the charge storage layer 14. Accordingly, a constant concentration distribution of the charge without variations is given inside the charge storage layer 14, to realize stable operation. Further, the conductive layer 30 has a function to improve the efficiency of reading and writing a charge stored in the charge storage layer 14.

The conductive layer 30 is, for example, a semiconductor film, a metal film, or a metal compound film. For example, it is possible to use polycrystalline silicon or amorphous silicon imparted with conductivity by introducing impurities.

In the case of the present embodiment, the charge storage molecule 25 is bonded onto the conductive layer 30 by self-assembling. At this time, when the conductive layer 30 is silicon, a chemically modified group to serve as a linker of the charge storage molecule 25 is desirably a silyl ether group from the viewpoint of facilitating bonding.

The method for manufacturing the semiconductor memory device according to the present embodiment includes: forming the tunnel insulating film 12 on the semiconductor layer 10; forming the conductive layer 30 on the tunnel insulating film 12; forming the charge storage layer 14 that contains the charge storage molecules 25 having the molecular structure of the molecular formula (1) on the conductive layer 30; forming the block insulating film 16 on the charge storage layer 14 by ALD, and forming the control gate electrode 18 on the block insulating film 16.

The conductive layer 30 is formed on the tunnel insulating film 12 for example by CVD, ALD, sputtering or the like. The charge storage layer 14 is then formed on the conductive layer 30.

This is similar to the first embodiment except that the tunnel insulating film 12 is formed on the semiconductor layer 10 and the charge storage layer 14 is formed on the conductive layer 30.

According to the present embodiment, similarly to the first embodiment, it is possible to realize a semiconductor memory device that accomplishes excellent charge retention properties. This leads to realization of a semiconductor memory device that operates stably and has excellent reading and writing characteristics.

Fourth Embodiment

A semiconductor memory device according to the present embodiment includes a stacked body in which an insulating layers and a control gate electrodes are alternately stacked, a semiconductor layer facing at least one of the control gate electrodes, and an organic molecular layer provided between the semiconductor layer and the at least one of the control gate electrode, and having an organic molecule that includes a molecular structure described by the above molecular formula (1).

The semiconductor memory device according to the present embodiment differs from the first embodiment in that it is a device with a three-dimensional structure, but descriptions of contents that overlap with those in the first embodiment will be omitted.

Figure 7:
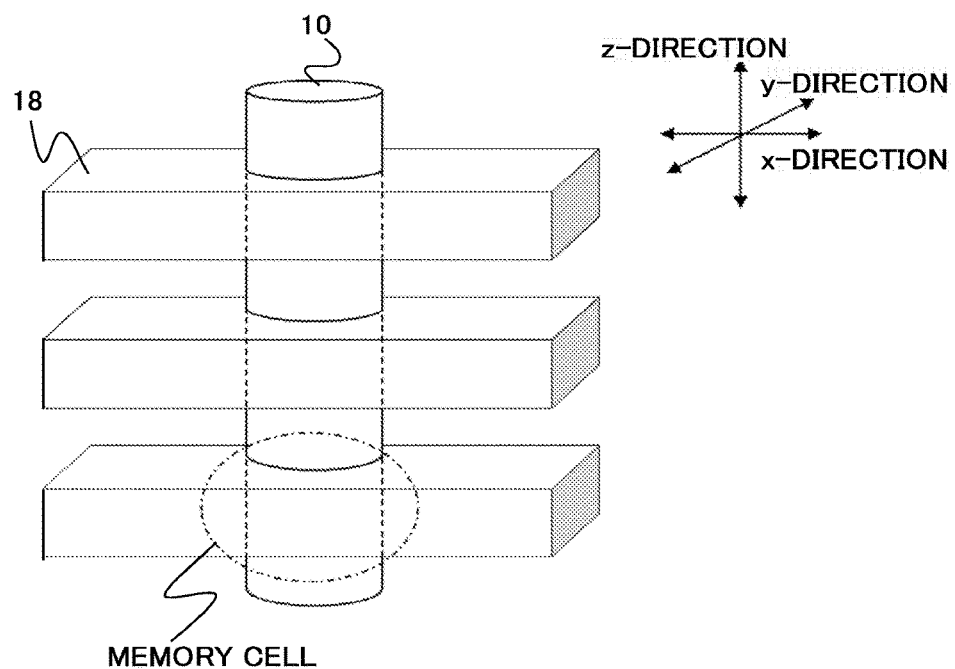
FIG. 7 is a three-dimensional conceptual view of a semiconductor memory device according to a fourth embodiment.
Figure 8:
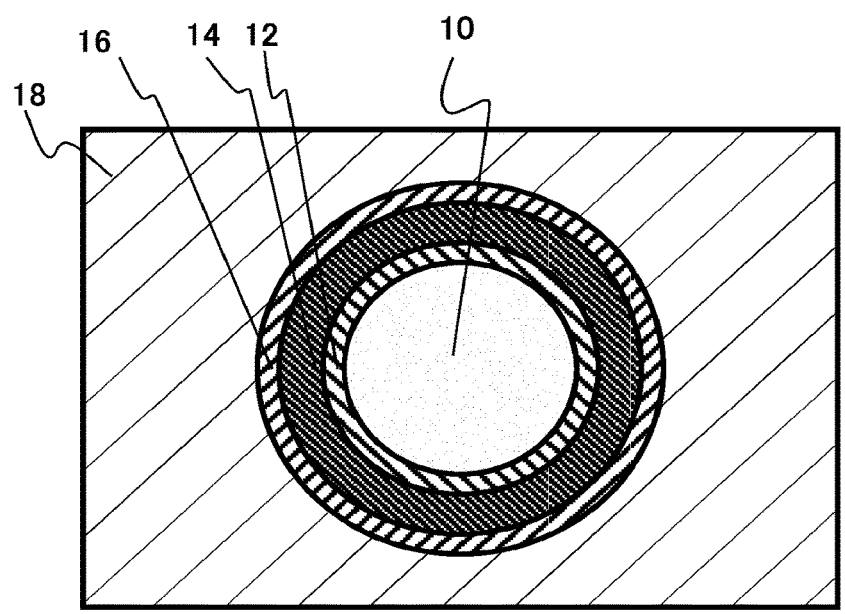
FIG. 8 is an X-Y sectional view of FIG. 7.
Figure 8:
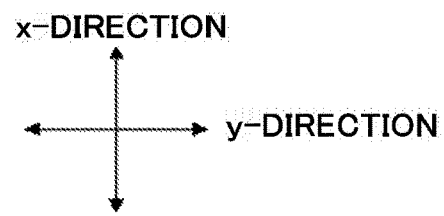
Figure 9:
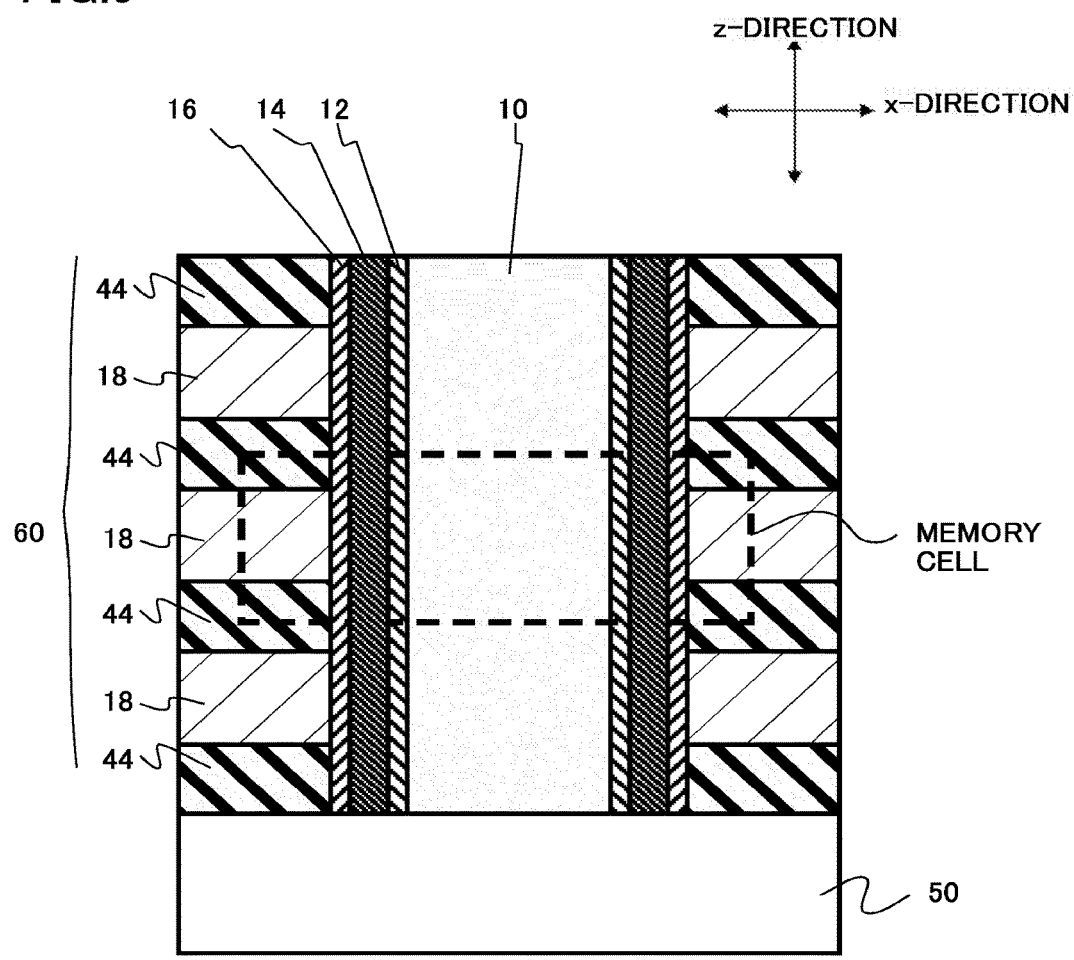
FIG. 9 is an X-Z sectional view of FIG. 7.

FIG. 7 is a three-dimensional conceptual view of the semiconductor memory device according to the present embodiment. FIG. 8 is an X-Y sectional view of FIG. 7. FIG. 9 is an X-Z sectional view of FIG. 7.

The semiconductor memory device according to the present embodiment is provided, for example, with a stacked body 60 where a plurality of insulating layers 44 and control gate electrodes 18 are alternately stacked on a silicon substrate 50.

Then, for example, a hole penetrating the stacked body 60 from its top to the lowermost control gate electrode 18 is provided. The block insulating film 16 is provided on the side surface of the hole, and the charge storage layer 14 is provided on the inner surface of the block insulating film 16.

Further, the tunnel insulating film 12 is provided on the inner surface of the charge storage layer 14. Moreover, the columnar semiconductor layer 10 is formed on the inner surface of the tunnel insulating film 12. It should be noted that the semiconductor layer 10 is not necessarily in the columnar shape, but may be in a film shape, for example.

In other words, there is provided the semiconductor layer 10 provided as opposed to a plurality of control gate electrodes 18. Then, the tunnel insulating film 12, the charge storage layer 14 and the block insulating film 16 are provided between the semiconductor layer 10 and the control gate electrode 18.

In each of FIGS. 7 and 9, a region surrounded by a dashed line is one memory cell. The memory cell has a structure in which the tunnel insulating film 12, the charge storage layer 14 and the block insulating film 16 are formed between the semiconductor layer 10 and the control gate electrode 18.

The charge storage molecule 25 in the charge storage layer 14 is an organic molecule including the molecular structure described by the molecular formula (1). The charge storage molecule 25 may be chemically bonded to either the semiconductor layer 10 side or the control gate electrode 18 side via a linker in the molecular formula (1). For example, it is possible to form a configuration where the charge storage molecule 25 is chemically bonded to the tunnel insulating film 12 via a linker. Further, for example, it is possible to form a configuration where the charge storage molecule 25 is chemically bonded to the block insulating film 16 via a linker.

It is to be noted that the three-dimensional structure of the present embodiment can be manufactured by applying the known method for manufacturing a semiconductor memory device with a three-dimensional structure.

According to the present embodiment, similarly to the first embodiment, it is possible to realize a semiconductor memory device that accomplishes excellent charge retention properties. Further, according to the present embodiment, the memory cell is made three-dimensional, to increase the integration degree of the memory cell, thereby allowing realization of a semiconductor memory device with a higher integration degree than those of the first to third embodiments.

Modified Example 1

Figure 10:
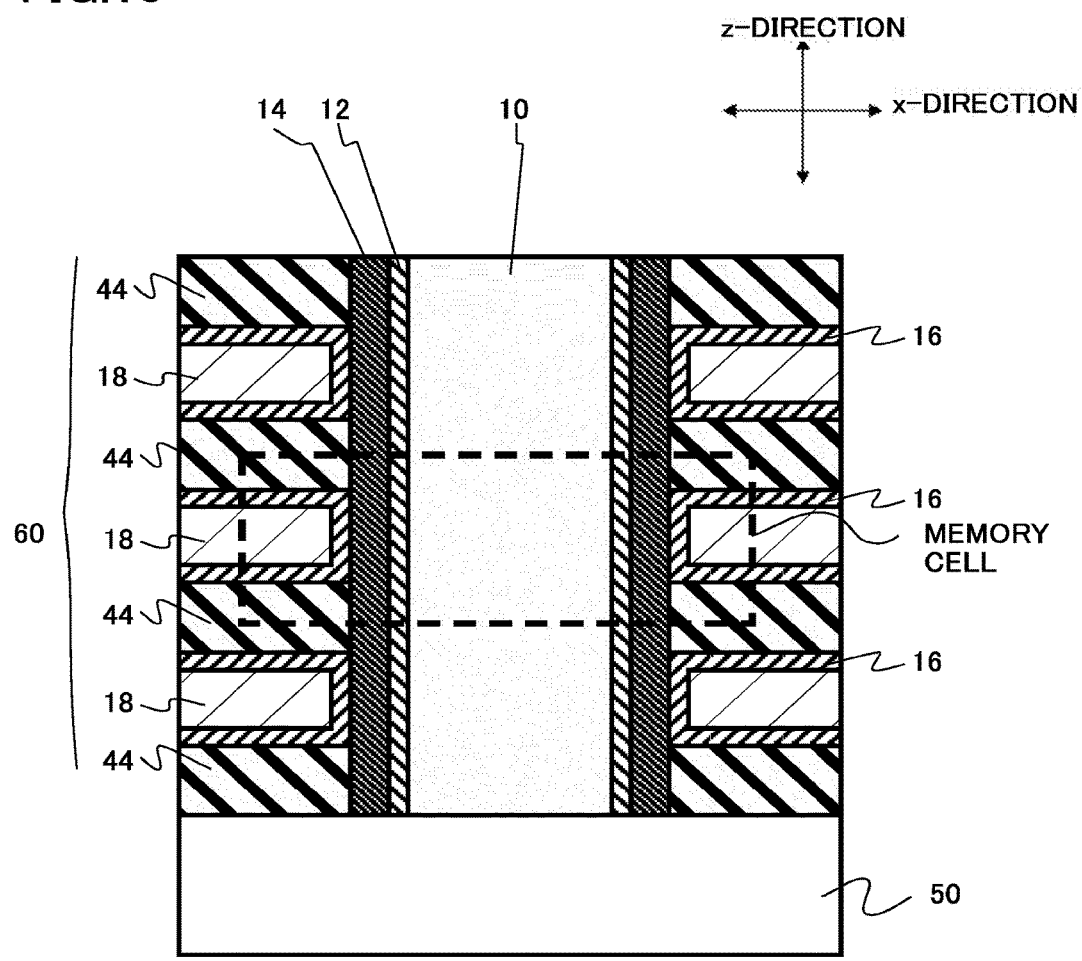
FIG. 10 is a sectional view of a semiconductor memory device according to Modified Example 1 of the fourth embodiment.

FIG. 10 is a sectional view of a semiconductor memory device according to Modified Example 1 of the present embodiment. FIG. 10 shows a cross section corresponding to the sectional view of FIG. 9. The block insulating film 16 is provided along and between the control gate electrode 18 and the insulating layer 44. The block insulating film 16 is divided with respect to each memory cell in a z-direction.

Modified Example 2

Figure 11:
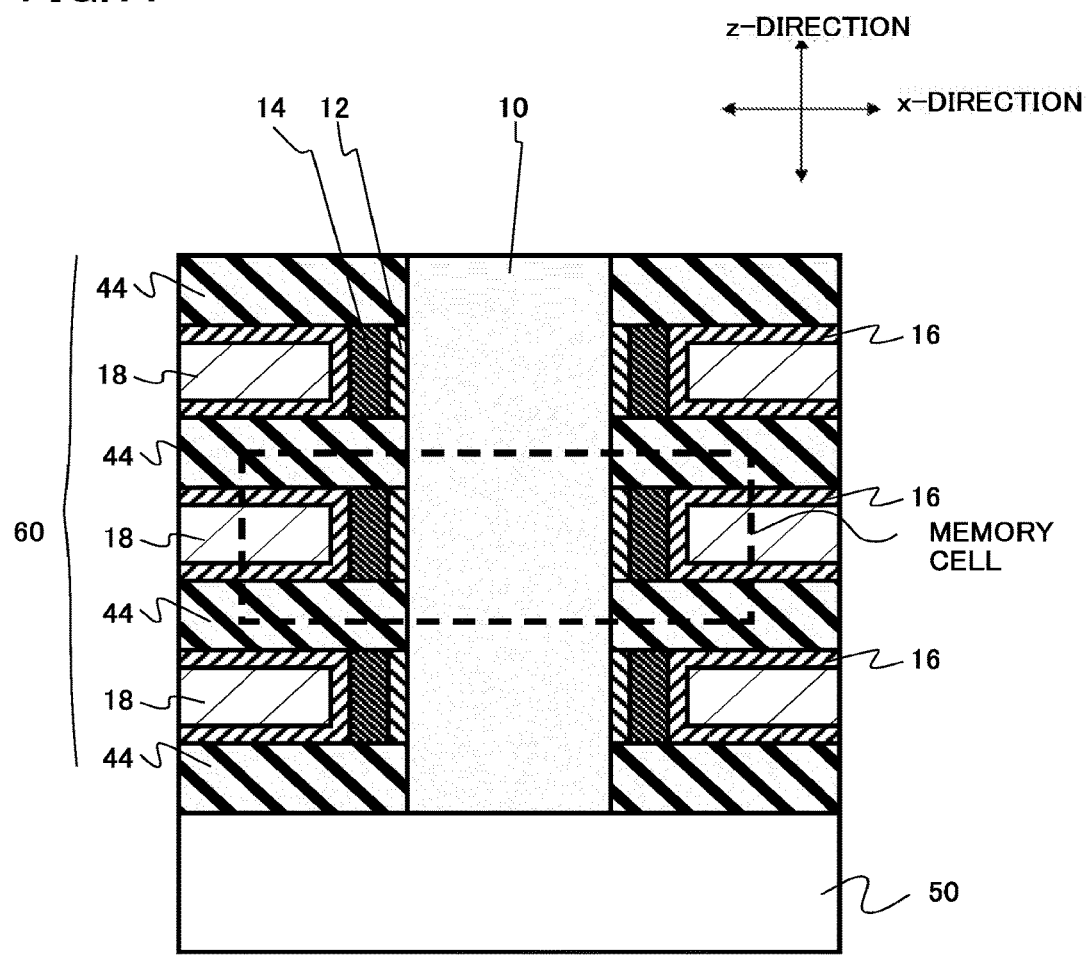
FIG. 11 is a sectional view of a semiconductor memory device according to Modified Example 2 of the fourth embodiment.

FIG. 11 is a sectional view of a semiconductor memory device according to Modified Example 2 of the present embodiment. FIG. 11 shows a cross section corresponding to the sectional view of FIG. 9. Similarly to Modified Example 1, the block insulating film 16 is provided along and between the control gate electrode 18 and the insulating layer 44. The block insulating film 16 is divided with respect to each memory cell in a z-direction. Further, the tunnel insulating film 12 and the charge storage layer 14 are also divided with respect to each memory cell in the z-direction.

EXAMPLES

In the following, examples will be described.

Example 1

A transistor with four terminals were produced by the following method.

A p-type silicon substrate was patterned by a photoresist and phosphorus ions are implanted, to form an n-type region. Subsequently, a silicon oxide film was formed on a channel region in a thermal oxidization furnace. A film thickness of the silicon oxide film was about 5 nm as a result of measuring the film thickness.

A substrate formed with the silicon oxide film was introduced to an Atomic Layer Deposition (ALD) device, and an aluminum oxide film was formed for just one cycle, to form a tunnel insulating film made up of a stacked film of the silicon oxide film and the aluminum oxide film.

The substrate formed with the tunnel insulating film was cleaned by irradiation of the surface of the formed aluminum oxide film by a UV cleaner for ten minutes. The cleaned substrate was soaked into a solution obtained by dissolving molecules having the molecular structure of the above molecular formula (5) into acetonitrile with a concentration of 1 mM, and allowed to stand during a whole day and night.

Thereafter, the substrate was removed from the solution and transferred into pure acetonitrile, and then rinsed while being stimulated by an ultrasonic cleaner for one minute. It is to be noted that this rinsing operation by means of In addition was performed twice in total as acetonitrile was replaced by a new one. Thereafter, the substrate rinsed by acetonitrile was transferred into pure ethanol, rinsed while being stimulated by the ultrasonic cleaner for a minute, and then dried using an air duster, to form a charge storage monomolecular film made up of molecules having the molecular structure of the molecular formula (5).

Next, the substrate was introduced to a thermal ALD device, to form a block insulating film of hafnium oxide on the charge storage monomolecular film at 150° C. A film thickness of the block insulating film of hafnium oxide was set to about 5 nm.

Subsequently, it was introduced to the RTA device, and annealed under an $N_2$ gas atmosphere mixed with 3% of $H_2$ at 300° C. for 30 minutes, and nickel with a thickness of about 100 nm was stacked on hafnium oxide by an electron beam (EB) deposition device. A deposited nickel film was patterned by a photoresist to be left only in a channel region, thereby forming a gate electrode.

Next, a source-drain unit linked to the channel region was patterned by a photoresist and wet-etched by buffered hydrogen, to expose the silicon surface. Aluminum with a thickness of about 100 nm was deposited on the surface, to form a source-drain electrode. Further, the rear surface of the substrate was wet-etched and cleaned, and aluminum with a thickness of about 200 nm was deposited, to form a substrate electrode, thereby producing a transistor made up of four terminals of the gate, source, drain and the substrate.

Example 2

A transistor was produced in a similar manner to that of Example 1 except for using molecules having the molecular structure of the above molecular formula (8).

Comparative Example

A transistor was produced in a similar manner to the examples except that a block film of hafnium oxide was formed directly on a tunnel film without using molecules.

A voltage of 8 V was written into the gate electrode of the transistor in each of Examples 1 and 2 and Comparative Example by taking the time of 100 ms, and a threshold voltage shift generated thereby was read, to perform tracing with respect to the elapsed time. It is to be noted that the reading was performed by constantly applying a source-voltage of 0.1 V to read a drain current obtained by applying a gate voltage of 0 V to 4 V, and a voltage obtained upon flowing of a drain current of $1\times10^{-7}$ A was taken as a threshold voltage.

Figure 12:
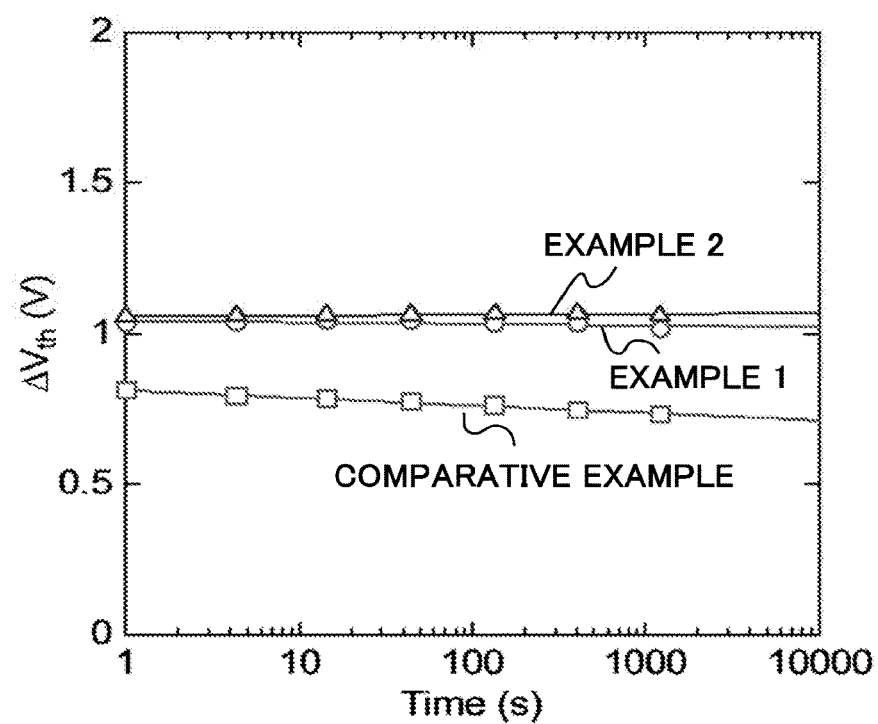
FIG. 12 is a diagram showing charge retention properties in Examples and Comparative Example.

FIG. 12 is a diagram showing charge retention properties in Examples 1 and 2 and Comparative Example. It shows time dependence of change in threshold voltage shift.

Elapsed time for 5% attenuation from an initial threshold voltage shift value has been calculated from FIG. 12 for the charge retention time. The calculation was performed by linearly logarithmically approximating a change in threshold voltage shift with time. The charge retention time was about 127 years in Example 1, no attenuation was seen in Example 2, and the charge retention time was about 43.6 seconds in Comparative Example. It was thus found that the charge storage time in each of Examples 1 and 2 is longer and more excellent than Comparative Example.

From the above result, it is possible to obtain the charge storage time of 10 years or longer by use of the charge storage monomolecular film of the present disclosure, and its industrial value is enormous.

While certain embodiments have been described, these embodiments have been presented by way of example only, and are not intended to limit the scope of the inventions. Indeed, the semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a semiconductor layer;
   a control gate electrode; and
   an organic molecular layer provided between the semiconductor layer and the control gate electrode, the organic molecular layer comprising an organic molecule including a molecular structure described by a molecular formula (1):

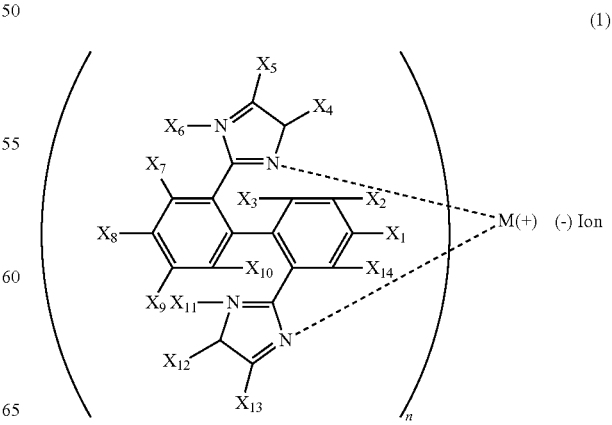

(1)

wherein M(+) in the molecular formula (1) is a positively charged metal ion selected from the group consisting of a copper ion, an iron ion, a ruthenium ion, a cobalt ion, an iridium ion, a manganese ion, a vanadium ion, a titanium ion, a zirconium ion, a silver ion, and a platinum ion, n is an integer that is 1 or larger and changes in accordance with a kind of the metal ion, $X_1$ to $X_{14}$ are a chemical structure, and (–)Ion is a negatively charged ion selected from the group consisting of a chlorine ion, a bromine ion, a triflate ion, a perchlorate ion, a hexafluorophosphorus ion, and a tetrafluoroboron ion.

2. The device according to claim 1, wherein
$X_1$ to $X_{14}$ in the molecular formula (1) are a chemical structure having a chemically modified group containing a chemical group selected from the group consisting of an ether group, a silyl ether group, a dimethylsilyl ether group, a diethylsilyl ether group, a carboxy ester group, a sulfonyl ester group, a phosphonic acid ester group, an amide group, a thioether group, an ether group, and a thioester group, or
$X_1$ to $X_{14}$ in the molecular formula (1) are a chemical structure selected from the group consisting of a hydroxyl group, a hydroxysilyl group, a trimethoxysilyl group, a diethylmethoxysilyl group, a triethoxysilyl group, a dimethylethoxysilyl group, a diethylethoxysilyl group, a trichlorosilyl group, a dimethylchlorosilyl group, a diethylchlorosilyl group, phosphonic acid, sulfonic acid, amino acid, a carboxyl group, a thiol group, an alkyl group consisting of hydrocarbon, a halogen group, and hydrogen, and
$X_1$ to $X_{14}$ are the same or different, at least one of $X_1$ to $X_{14}$ is a chemically modified group containing a chemical group selected from the group consisting of an ether group, a silyl ether group, a dimethylsilyl ether group, a diethylsilyl ether group, a carboxy ester group, a sulfonyl ester group, a phosphonic acid ester group, an amide group, a thioether group, an ether group, and a thioester group.

3. The device according to claim 1, wherein the organic molecular layer is a monomolecular film.

4. The device according to claim 1, wherein the organic molecule includes a molecular structure described by a molecular formula (2):

$X_1$ to $X_{28}$ in the molecular formula (2) are a chemical structure.

5. The device according to claim 1, wherein the organic molecule includes a molecular structure described by a molecular formula (3):

(3)

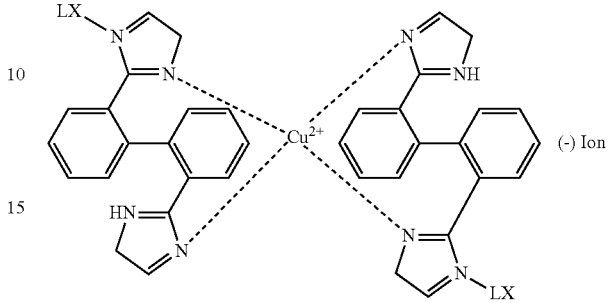

at least one of LX in the molecular formula (3) is a chemically modified group for chemically bonding the organic molecule to a region close to the semiconductor layer or a region close to the control gate electrode.

6. The device according to claim 1, wherein the organic molecule include a molecular structure described by a molecular formula (4):

(4)

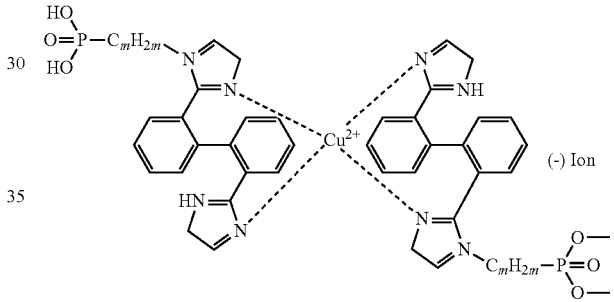

m in the molecular formula (4) is an integer of 0 or larger.

7. The device according to claim 1, wherein the organic molecule includes a molecular structure described by a molecular formula (5):

(2)

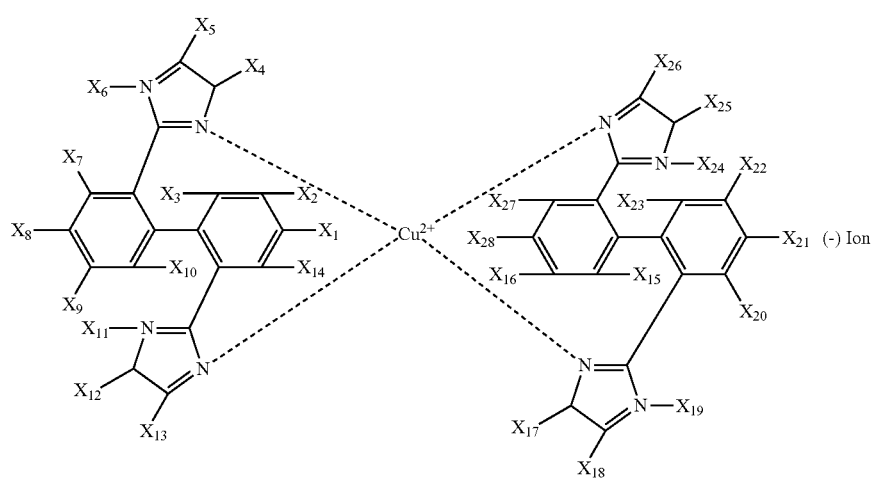

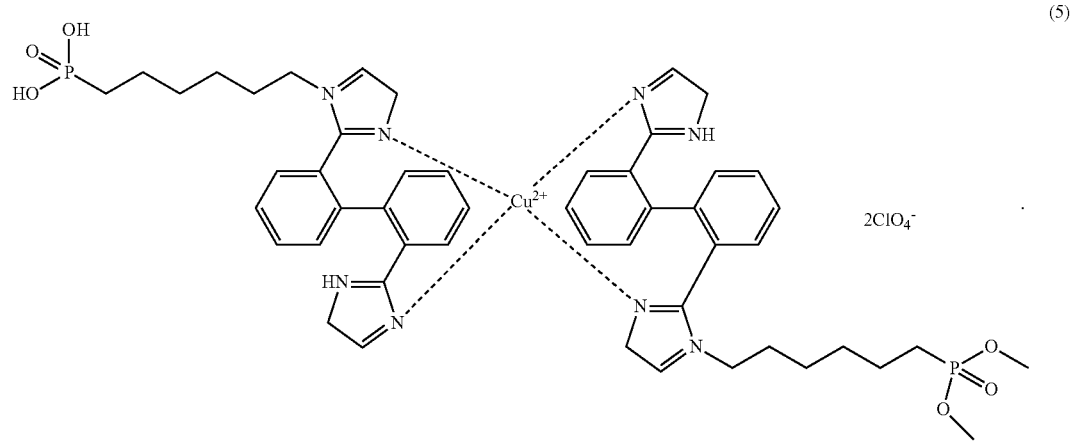
(5)

8. The device according to claim 1, wherein the organic molecule includes a molecular structure described by a molecular formula (6):

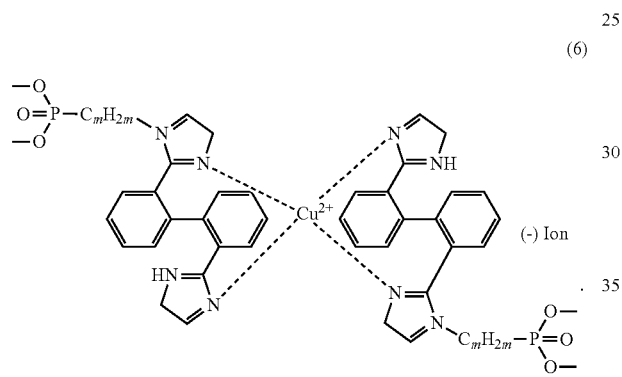
(6)

9. The device according to claim 1, wherein the organic molecule includes a molecular structure described by a molecular formula (7):

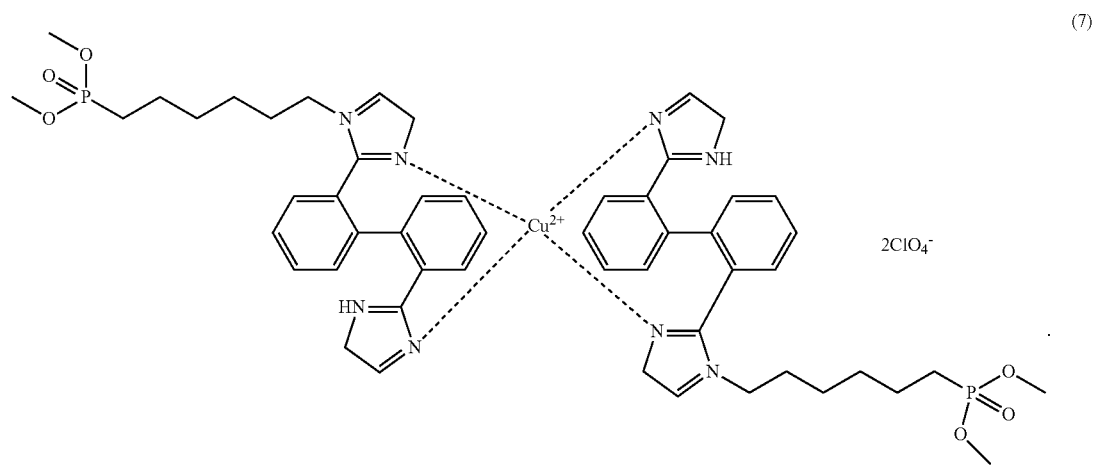
(7)

10. The device according to claim 1, wherein the organic molecule includes a molecular structure described by a molecular formula (8):

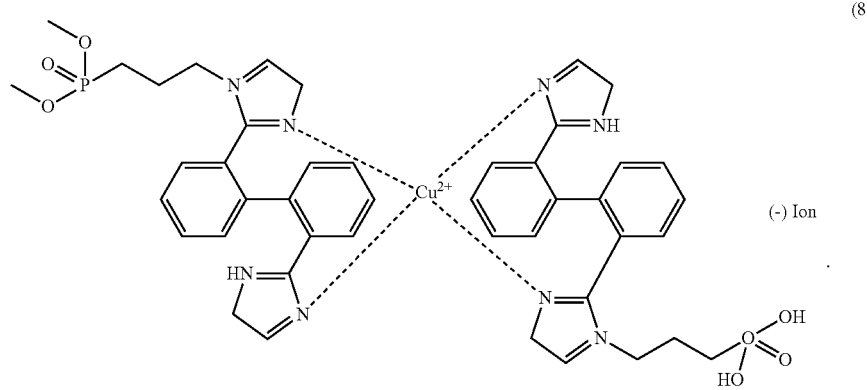

(8)

(-) Ion

11. The device according to claim 1, wherein the organic molecule includes a molecular structure described by a molecular formula (9):

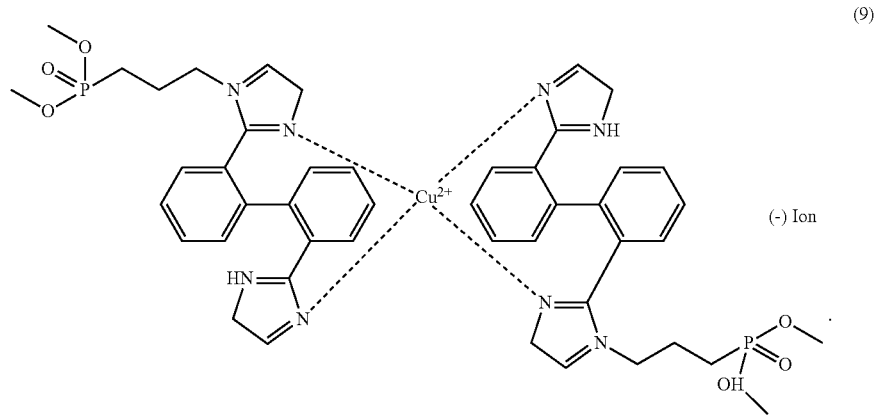

(9)

(-) Ion

12. The device according to claim 1, further comprising a block insulating film provided between the organic molecular layer and the control gate electrode.

13. The device according to claim 1, further comprising a tunnel insulating film provided between the semiconductor layer and the organic molecular layer.

14. The device according to claim 12, wherein the block insulating film contains at least one metal oxide selected from the group consisting of hafnium oxide, aluminum oxide, silicon oxide, zirconium oxide, and titanium oxide.

15. The device according to claim 13, wherein the tunnel insulating film contains a silicon oxide film or an aluminum oxide film.

* * * * *